United States Patent [19]
Choy et al.

[11] Patent Number: 5,789,944
[45] Date of Patent: Aug. 4, 1998

[54] ASYNCHRONOUS ANTICONTENTION LOGIC FOR BI-DIRECTIONAL SIGNALS

[75] Inventors: Garrett Choy, San Jose; W. Alfred Graf, III, Saratoga, both of Calif.

[73] Assignee: Cypress Semiconductor Corp., San Jose, Calif.

[21] Appl. No.: 672,723

[22] Filed: Jun. 28, 1996

[51] Int. Cl.$^6$ ............................................. H03K 19/0175
[52] U.S. Cl. ........................... 326/82; 326/21; 326/26; 326/93
[58] Field of Search ................... 326/93, 82, 86, 326/90, 56, 105, 26, 28, 37, 46; 327/407; 370/447; 395/728

[56] References Cited

U.S. PATENT DOCUMENTS

| | | | |
|---|---|---|---|
| 4,870,302 | 9/1989 | Freeman | 307/465 |
| 4,987,319 | 1/1991 | Kawana | 326/86 |
| 5,086,427 | 2/1992 | Whittaker et al. | 370/85.1 |
| 5,136,185 | 8/1992 | Fleming et al. | 326/82 |
| 5,248,908 | 9/1993 | Kimura | 326/86 |
| 5,251,305 | 10/1993 | Murphy, Jr. et al. | 395/325 |
| 5,394,034 | 2/1995 | Becker et al. | 326/82 |
| 5,424,982 | 6/1995 | Kato | 326/105 |
| 5,646,553 | 7/1997 | Mitchell et al. | 326/86 |
| 5,648,733 | 7/1997 | Worrell et al. | 326/86 |

*Primary Examiner*—Jon Santamauro
*Attorney, Agent, or Firm*—Blakely, Sokoloff Taylor & Zafman LLP

[57] ABSTRACT

An asynchronous anticontention circuit for a bi-directional bus. The asynchronous anticontention circuit comprises an anticontention circuit coupled to an asynchronous delay circuit. The anticontention circuit receives a driver select signal and generates a first signal and a second signal. The first signal and the second signal each have an active state and an inactive state. When the driver select signal is in a first logic state, the first signal is in the inactive state and the second signal is in the active state. When the driver select signal transitions from the first logic state to a second logic state, the anticontention circuit transitions the second signal from the active state to the inactive state. The asynchronous delay circuit couples the transition of the second signal to the anticontention circuit after a delay of time. After the delay of time, the anticontention circuit transitions the first signal from the inactive state to the active state. In operation, the first signal may be coupled to a first input/output circuit, the second signal may be coupled to a second input/output circuit, and the first and second input/output circuits may be coupled to a bi-directional bus.

31 Claims, 10 Drawing Sheets

ASYNCHRONOUS ANTICONTENTION LOGIC FOR BI-DIRECTIONAL SIGNALS

CROSS-REFERENCE TO RELATED APPLICATIONS

This application is related to subject matter in copending U.S. patent application Ser. No. 08/672,730, filed concurrently with this application on Jun. 28, 1996, entitled "SYNCHRONOUS CONTENTION PREVENTION LOGIC FOR BI-DIRECTIONAL SIGNALS," and incorporated herein by reference in its entirety.

BACKGROUND OF THE INVENTION

1. Field of the Invention

The present invention relates to bi-directional signal communication. More particularly, the present invention relates to preventing contention of bi-directional signals on a bi-directional bus.

2. Discussion of the Background

When two devices (integrated circuits, systems, etc.) are coupled to a bi-directional bus, some means of arbitration must be employed so that the devices do not simultaneously drive data onto the bi-directional bus. If both devices simultaneously drive the bi-directional bus, then bus contention occurs. Bus contention corrupts the data driven by the contending devices.

One method of preventing bus contention between two devices has been to use handshaking signals to communicate between the devices. In a typical example, a first device has control of the bi-directional bus and a second device desires to drive data on the bus. The second device sends a "bus request signal" to the first device. When the first device has completed driving its data on the bi-directional bus, the first device sends an "acknowledge signal" to the second device. The first device then releases the bi-directional bus for use by the second device. The second device receives the acknowledge signal and then can drive data onto the bus.

One disadvantage of the handshaking method is the latency involved, that is, it requires many clock cycles in order to successfully arbitrate between the devices for control of the bi-directional bus. Before the second device can drive the bus, it must first alert the first device of its intention to take control of the bus. The second device must then wait for the acknowledge signal to arrive before it can drive the bi-directional bus.

Another disadvantage of the handshaking method is the amount of logic and circuitry typically used to perform the handshaking communication. Both the first device and the second device must incorporate circuitry to generate and process the handshaking signals. Furthermore, the state machine controllers of each of the devices must contain sufficient logic and additional states to control the handshaking communication.

Another disadvantage of the handshaking method is that it can require as many as four additional pins on each device to communicate the request and acknowledge signals between the two devices. For example, each device may require two output pins to output request and acknowledge signals, and an additional two input pins to receive request and acknowledge signals.

It is believed that another method for preventing bus contention between devices has been to incorporate an anticontention logic function into the system state machine controller. The system state machine controller typically resides in one of the two devices. The system state machine controller controls the overall function of a device. By incorporating the arbitration function into the system state machine controller, the system state machine controller can decide which device has access to the bus and when access may occur.

One disadvantage of incorporating the arbitration circuitry and logic into the system state machine controller is that it adds additional complexity (e.g. a greater number of states) to the system state machine controller. Moreover, additional machine cycles are consumed in performing the arbitration function. Furthermore, extra time may be required to determine if and how the system state machine controller will prevent bus contention. In addition, the speed of the bi-directional data transfer may be reduced, resulting in the introduction of performance-dampening "wait states" in the system.

Another disadvantage of incorporating the arbitration circuitry and logic into the system state machine controller is that the arbitration circuitry and logic are typically not modular. Modularity increases system performance by removing tasks from the system state machine controller which can be performed by separate pieces of circuitry. Moreover, incorporating the arbitration circuitry and logic into the system state machine controller complicates later modifications to the system state machine controller. Thus, later modifications to the system state machine controller can inadvertently disrupt the ability of the system state machine controller to prevent bus contention.

Therefore, it is desirable to have a method and apparatus for preventing contention between two or more devices on a bi-directional bus that: (a) utilizes a small number of device pins and circuitry; (b) performs the arbitration function quickly and preferably without the introduction of wait states into the system; (c) may be modular and thus separate and/or independent from the system state machine; (d) does not unnecessarily complicate the system state machine; and (e) performs the anticontention function in an asynchronous fashion.

SUMMARY OF THE INVENTION

The present invention concerns an asynchronous anticontention circuit for a bi-directional bus. The asynchronous anticontention circuit comprises an anticontention circuit coupled to an asynchronous delay circuit. The anticontention circuit receives a driver select signal and generates a first signal and a second signal. The first signal and the second signal each have an active state and an inactive state. When the driver select signal is in a first logic state, the first signal is in the inactive state and the second signal is in the active state. When the driver select signal transitions from the first logic state to a second logic state, the anticontention circuit transitions the second signal from the active state to the inactive state. The asynchronous delay circuit couples the transition of the second signal to the anticontention circuit after a delay of time. After the delay of time, the anticontention circuit transitions the first signal from the inactive state to the active state. In operation, the first signal may be coupled to a first input/output circuit, the second signal may be coupled to a second input/output circuit, and the first and second input/output circuits may be coupled to a bi-directional bus.

The present invention also concerns a method of asynchronously preventing contention on a bi-directional bus comprising the steps of: disabling a first input/output circuit from driving the bi-directional bus in response to a first transition of a driver select signal; and enabling a second input/output circuit to drive the bi-directional bus after a first delay of time. The method may further comprise the steps of: disabling the second input/output circuit from driving the bi-directional bus in response to a second transition of a driver select signal; and enabling the first input/output circuit to drive the bi-directional bus.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

An asynchronous anticontention circuit for bi-directional signals is described. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
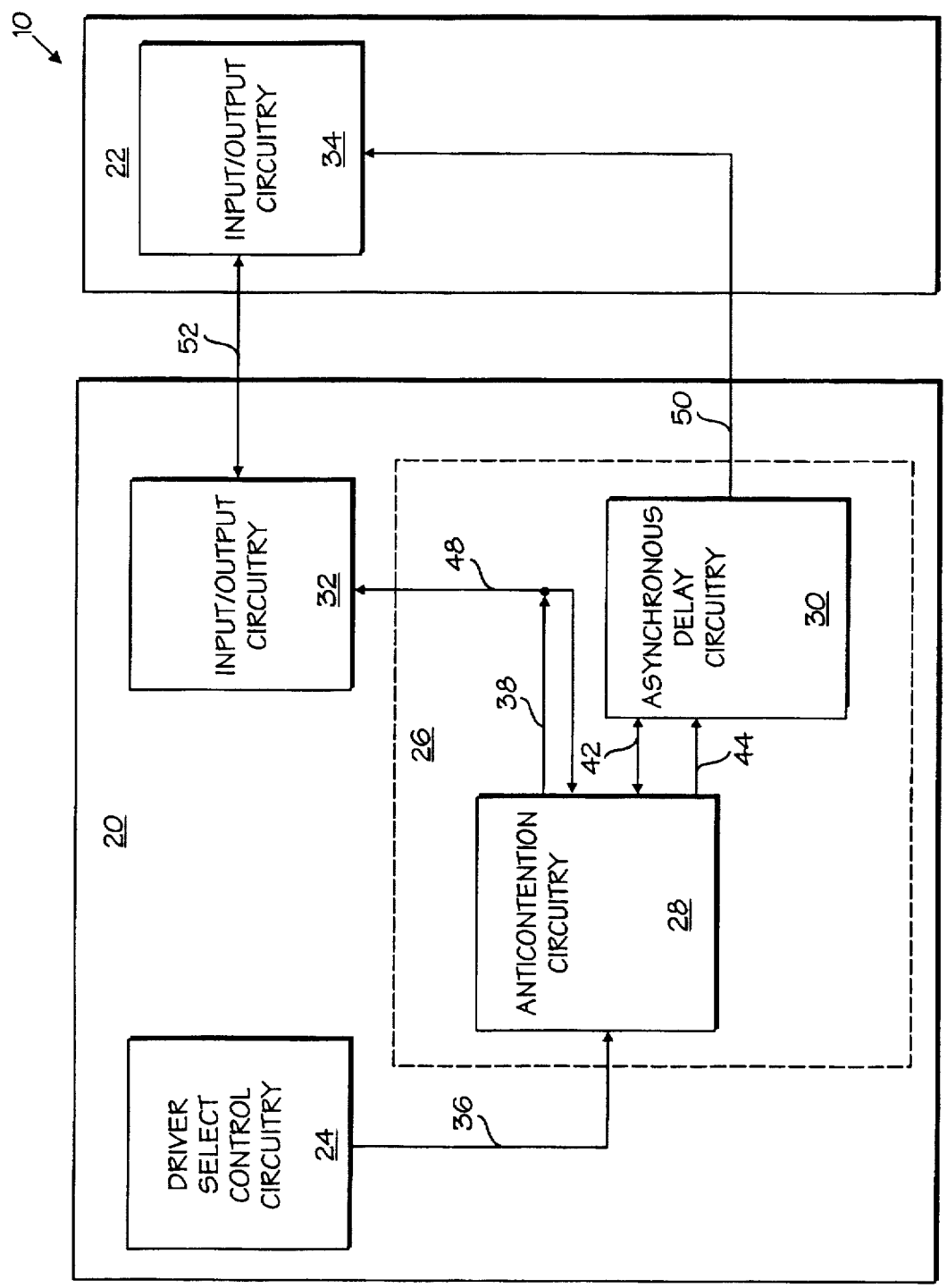
FIG. 1 is a block diagram of one embodiment of the present invention.

FIG. 1 shows a system 10 comprising first device 20 and second device 22 coupled to bi-directional bus 52. First device 20 and second device 22 may comprise integrated circuits, discrete circuits, or systems. For one embodiment, first device 20 and second device 22 each comprise programmable logic devices and bus 52 is a printed circuit board trace or a separate wire. For another embodiment, first device 20, second device 22, and bi-directional bus 52 are included in a single device.

First device 20 includes asynchronous anticontention circuitry 26 coupled to driver select control circuitry 24 and input/output circuitry 32. Second device 22 includes input/output circuitry 34. Asynchronous anticontention circuitry 26 is coupled to input/output circuitry 34 via line 50. Asynchronous anticontention circuitry 26, input/output circuitry 32, and input/output circuitry 34 comprise asynchronous contention prevention circuitry for bi-directional bus 52.

Input/output circuitry 32 and input/output circuitry 34 are coupled to bi-directional bus 52. Bi-directional bus 52 may comprise a single bi-directional line or a plurality of bi-directional lines.

As illustrated in FIG. 1, first device 20 requires only one output and second device 22 requires only one input in order to implement bus arbitration. The one output of first device 20 outputs a bus control signal on line 50. The one input of second device 22 receives the bus control signal on line 50.

Driver select control circuitry 24 comprises control circuitry that determines whether first device 20 or second device 22 should control or drive data onto bi-directional bus 52. For one embodiment, driver select control circuitry 24 may be part of a system state machine controller for system 10 or a state machine controller of first device 20. For an alternative embodiment, driver select control circuitry 24 may be circuitry which communicates with the system state machine controller or the state machine controller of first device 20.

Driver select control circuitry 24 generates a driver select signal and couples the driver select signal to asynchronous anticontention circuitry 26 via line 36. The driver select signal indicates whether first device 20 or second device 22 may drive data onto bi-directional bus 52. For example, when the driver select signal is in a first logic state (e.g. low) asynchronous anticontention circuitry 26 sends a signal on line 50 to input/output circuitry 34 which enables input/output circuitry 34 to drive data onto bi-directional bus 52. Similarly, when the driver select signal is in a second logic state (e.g. high) asynchronous anticontention circuitry 26 sends a signal on line 48 to input/output circuitry 32 which enables input/output circuitry 32 to drive data onto bi-directional bus 52. The signal on line 48 is coupled back to anticontention circuitry 28. The signals on lines 48 and 50 will ensure that only one of input/output circuitry 32 or input/output circuitry 34 will be able to drive data onto bi-directional bus 52 at any given time.

Asynchronous anticontention circuitry 26 is modular or self-timing, that is, asynchronous anticontention circuit 26 is not part of the system state machine or the state machine of device 20; rather, it receives the driver select signal from driver select control circuitry 24 and then performs the steps necessary to prevent contention on bi-directional bus 52. Therefore, the system state machine does not have to perform arbitration and the system state machine is not further complicated. Additionally, there is a very low probability that changes in the system state machine will affect the driver select signal. Thus, there is a very low probability that changes in the system state machine will cause the arbitration performed by asynchronous anticontention circuitry 26 to be inadvertently altered.

Asynchronous anticontention circuitry 26 comprises anticontention circuitry 28 coupled to asynchronous delay circuitry 30 via lines 42 and 44. Anticontention circuitry 28 is coupled to input/output circuitry 32 via line 48. Line 48 is also coupled back to anticontention circuitry 28. Asynchronous delay circuitry 30 is coupled to input/output circuitry 34 via line 50. Anticontention circuitry 28 and asynchronous delay circuitry 30 function together to enable and disable input/output circuitry 32 and input/output circuitry 34 so that there is no contention on bi-directional bus 52.

Asynchronous anticontention circuitry 26 prevents contention on bi-directional bus 52 as follows. Assume that driver select control circuitry 24 has generated a driver select signal line on line 36 having a first logic state for a period of time so that input/output circuitry 34 controls bi-directional bus 52. At a later point in time, driver select control circuitry 24 determines that input/output circuitry 32 should have access to and drive data on bi-directional bus 52. Therefore, asynchronous anticontention circuitry 26 must first disable input/output circuitry 34 from driving data on bi-directional bus 52, then enable input/output circuitry 32 to drive data onto bi-directional bus 52.

Driver select control circuitry 24 transitions the driver select signal on line 36 to a second logic state. Anticontention circuitry 28 then generates a signal on line 44. In response to the signal on line 44, asynchronous delay circuitry 30 generates a signal on line 50. The signal on line 50 disables input/output circuitry 34 from driving data onto bi-directional bus 52. For one embodiment, the signal on line 44 is the same signal as the signal on line 50.

It will take a certain amount of time due to an intrinsic delay of system 10 for the signal on line 50 to travel from asynchronous delay circuitry 30 to input/output circuitry 34, and to disable input/output circuitry 34 from driving data onto bi-directional bus 52. The intrinsic delay includes the signal speed on line 50, drive capability of asynchronous delay circuitry 30, loading on line 50, time required for the signal on line 50 to travel from the input of second device 22 to input/output circuitry 34, time required to disable input/output circuitry 34 from driving bi-directional bus 52, and time required to enable input/output 34 to receive data from bi-directional bus 52.

When input/output circuitry 34 has been disabled from driving data onto bi-directional bus 52, neither input/output circuitry 32 nor input/output circuitry 34 drives data onto bi-directional bus 52. In response to the signal on line 50, asynchronous delay circuitry 30 generates a signal on line 42 after a delay of time. The delay of time introduced by asynchronous delay circuitry 30 must exceed the intrinsic delay in system 10 to prevent bus contention.

In response to the signal on line 42 and the device select signal on line 36, anticontention circuitry 28 generates signals on lines 38 and 48 that enable input/output circuitry 32 to drive data onto bi-directional bus 52.

The intrinsic delay of system 10 must be less than the sum of compensating delay of asynchronous delay circuitry 30 and the time required for anticontention circuitry 28 to generate the signal on line 48.

Asynchronous delay element 30 may comprise any delay element which provides the requisite amount of compensating delay. For one embodiment, asynchronous delay circuitry 30 comprises a resistor. For another embodiment, asynchronous delay circuitry 30 comprises an inverting or non-inverting buffer or a plurality of inverting or non-inverting buffers. For another embodiment, asynchronous delay circuitry 30 comprises an RC circuit.

For another embodiment, asynchronous delay circuitry 30 comprises a programmable delay circuit which may be programmed either by the system or device manufacturer, or by the end-user. The programmable delay circuit may be programmed to produce a desired compensating delay of time. For example, a string of buffers may be coupled together by programmable elements that may be configured to provide a programmable delay as is generally known in the art.

When driver select control circuitry determines that input/output circuitry 34 should again drive data onto bi-directional bus 52, driver select control circuitry 24 transition the driver select signal on line 36 from the second logic state to the first logic state. This causes anticontention circuitry 28 to generate a signal on line 48 that disables input/output circuitry 32 from driving data onto bi-directional bus 52.

Anticontention circuitry 28 also generates another signal on line 44 in response to the transition by driver select signal on line 36. The signal on line 44 causes asynchronous delay circuitry 30 to generate a signal on line 50. After the intrinsic delay of system 10, the signal on line 50 enables input/output circuitry 34 to drive data onto bi-directional bus 52. Thus, the intrinsic delay of system 10 prevents bus contention.

Figure 2:
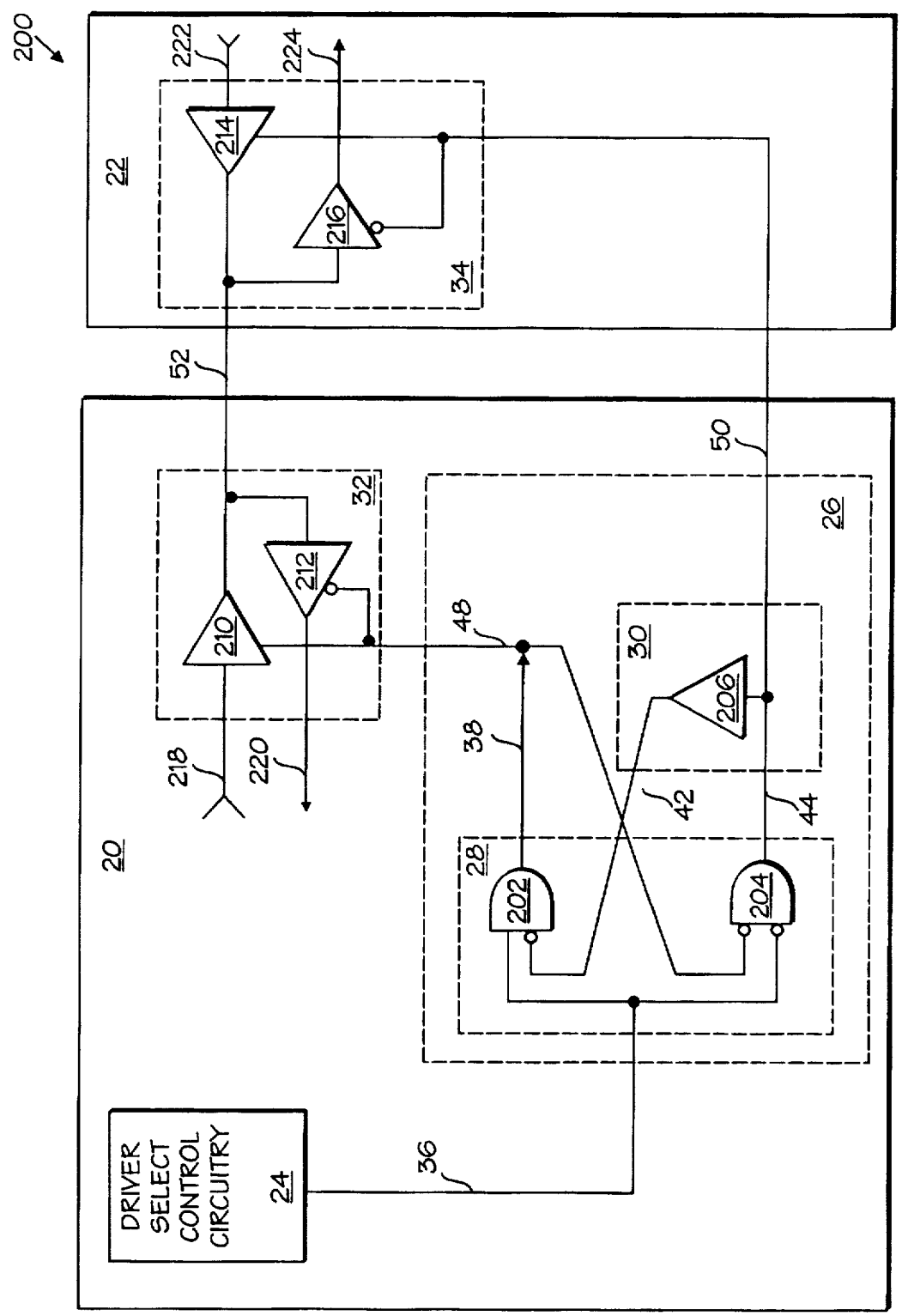
FIG. 2 is a circuit diagram of another embodiment of the present invention.

FIG. 2 illustrates system 200 which is one embodiment of system 10 illustrated in FIG. 1. Anticontention circuitry 28 comprises two AND gates 202 and 204. Asynchronous delay circuitry 30 comprises delay element 206 having an input coupled to lines 44 and 50 and the output of AND gate 204. An output of delay element 206 is coupled to line 42 and the active low input of AND gate 202. The active high input of AND gate 202 is coupled to line 36. The output of AND gate 202 is coupled to line 48. One of the two active low inputs of AND gate 204 is coupled to line 36 and the other active low input is coupled to line 48. It will be appreciated that AND gate 204 is configured as the equivalent of a NOR gate.

Figure 10:
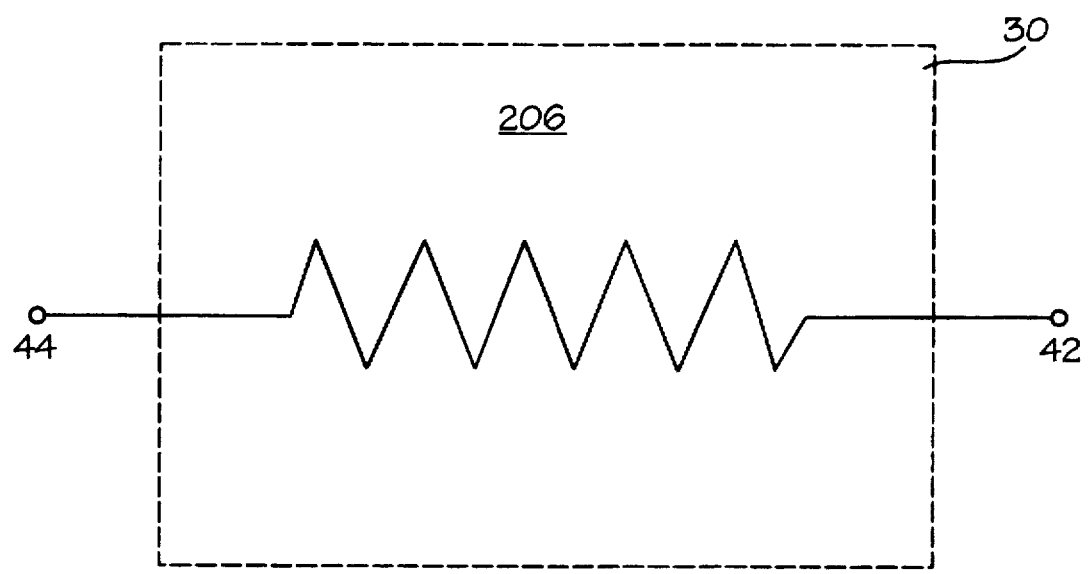
FIG. 10 is one embodiment of an asynchronous delay circuit.

Delay element 206 comprises a means for introducing a delay so that a signal on lines 44 and 50 is coupled to line 42 after a delay of time. As previously described, the delay element may comprise a resistor (as shown in FIG. 10), one or more inverting or non-inverting buffers, an RC circuit, or a circuit with a programmable amount of delay.

Figure 3:
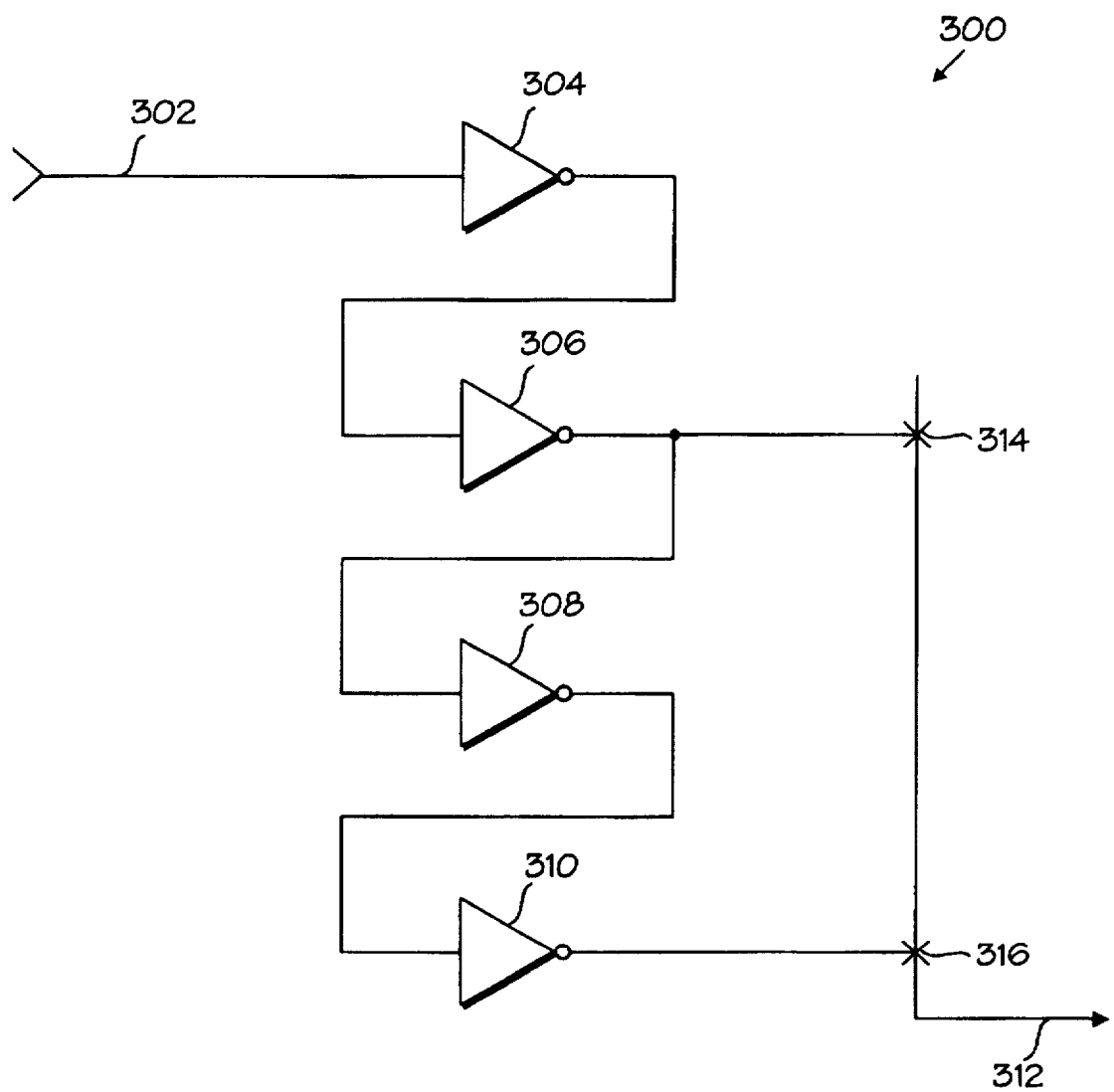
FIG. 3 shows one embodiment of the asynchronous delay circuitry of FIG. 2.

FIG. 3 illustrates programmable delay circuit 300 which is one embodiment of delay element 206. Programmable delay circuit 300 includes inverters 304, 306, 308, 310 interconnected in a daisy chain fashion. Inverter 304 receives an input signal on line 302 which comprises line 50 in FIG. 2. The outputs of inverters 306 and 310 are coupled to output line 312 by programmable elements 314 and 316. Any type of programmable element may be used for programmable elements 314 and 316 including fuse and antifuse technologies, EPROM, EEPROM, SRAM, or flash technologies. Output line 312 in FIG. 3 corresponds to line 42 in FIG. 2.

Programmable delay circuit 300 has a variable amount of delay by programming the programmable elements 314 and 316. For example, programmable delay circuit 300 has a maximum amount of delay when programmable element 314 is programmed to disconnect inverter 306 from output line 312 and programmable element 316 is programmed to connect inverter 310 to output line 312. Any number of inverting or non-inverting buffers may be used, so long as, when the signal on line 302 and the signal on line 312 have the same logical state, the input of AND gate 202 is an active low input, and when the signal on line 302 has a different state than the signal on line 312, the input of AND gate 202 is an active high input. For one embodiment, programmable delay circuit 300 comprises ten inverters.

Input/output circuitry 32 comprises driver 210 and receiver 212. When the signal on line 48 is a high logic state driver 210 is enabled and receiver 212 is disabled. When enabled, driver 210 receives an internal signal from first device 20 on line 218 and drives the internal signal onto bi-directional bus 52. When the signal on line 48 is a low logic state, receiver 212 is enabled and driver 210 is disabled. When enabled, receiver 212 receives a signal from bi-directional bus 52 (from input/output circuitry 34) and couples the signal to line 220 for use by first device 20.

Similarly, input/output circuitry 34 comprises driver 214 and receiver 216. When the signal on line 50 is a high logic state driver 214 is enabled and receiver 216 is disabled. When enabled, driver 214 receives an internal signal from second device 22 on line 222 and drives the internal signal onto bi-directional bus 52. When the signal on line 50 is a low logic state, receiver 216 is enabled and driver 214 is disabled. When enabled, receiver 216 receives a signal from bi-directional bus 52 (from input/output circuitry 32) and couples the signal to line 224 for use by second device 22.

It will be appreciated that input/output circuitry 32 and input/output circuitry 34 may each comprise more than one set of drivers and receivers coupled to lines 48 and 50, respectively, to drive a plurality of bus lines. Additionally, the logic states on lines 48 and 50 for enabling and disabling drivers 210 and 214 and receivers 212 and 216 may be altered as generally known in the art.

Figure 4:
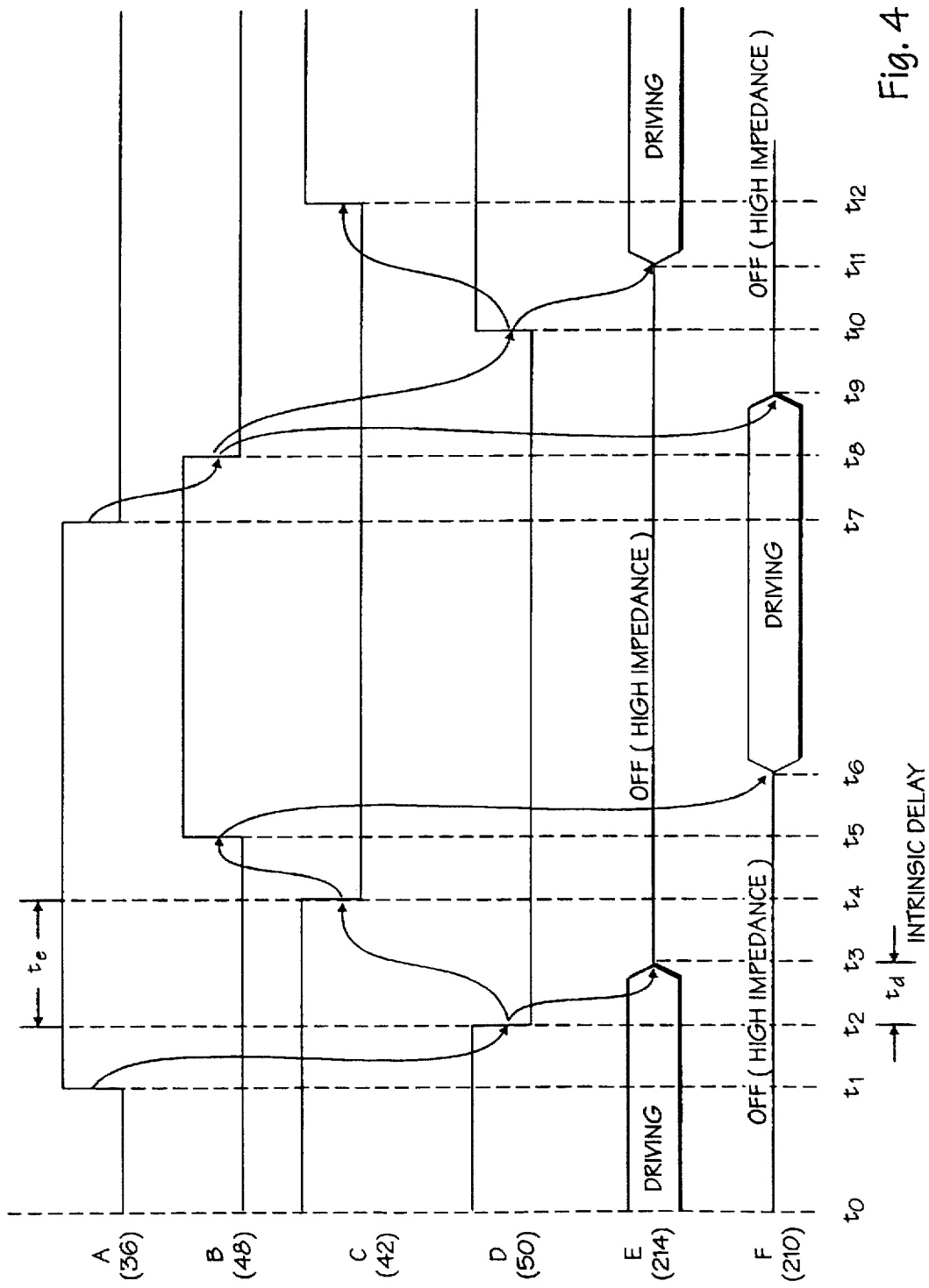
FIG. 4 is a timing waveform diagram for the embodiment of the present invention illustrated in FIG. 2.

The operation of the circuitry illustrated in FIG. 2 will be described with the aide of the illustrative timing waveform diagram shown in FIG. 4. In FIG. 4, waveform A corresponds to the driver select signal on line 36, waveform B corresponds to the signal on line 48, waveform C corresponds to the signal on line 42, waveform D corresponds to the signal on line 50, waveform E corresponds to the output of driver 214 driving bi-directional bus 52 (high and low levels indicate driver 214 is driving data onto bi-directional bus 52, and an intermediate level represented by a solid single line indicates that driver 214 is not driving bi-directional bus 52 and is in a high impedance state), and waveform F corresponds to the output of driver 210 driving bi-directional bus 52 (high and low levels indicate driver 210 is driving data onto bi-directional bus 52, and an intermediate level represented by a solid single line indicates that driver 210 is not driving bi-directional bus 52 and is in a high impedance state).

At time t0, the driver select signal on line 36 is in a low logic state, the signal on line 48 is in a low logic state or inactive, the signal on lines 42 and 50 are in a high logic state or active, input/output circuitry 34 is enabled to drive data onto bi-directional bus 52, and input/output circuitry 32 is disabled from driving data onto bi-directional bus 52.

At some point in time after time t0, driver select control circuitry 24 will communicate to asynchronous anticontention circuitry 26 that input/output circuitry 32 should have control of bi-directional bus 52. At time t1, driver select control circuitry 24 transitions the driver select signal on line 36 to a high logic state. This will cause the signal on line 44 and line 50 to transition from a high (active) logic state to a low (inactive) logic state at time t2.

After the signal on line 50 has transitioned to a low logic state at time t2, driver 214 will be disabled from driving data onto bi-directional bus 52 at time t3. The difference between times t2 and t3 includes the intrinsic delay $t_d$ of system 200. The intrinsic delay of system 200 includes the time required for the signal on line 50 to travel from the output of AND gate 204 to input/output circuitry 34, time required to disable driver 214 from driving bi-directional bus 52, and time required to enable receiver 216 to receive data from bi-directional bus 52.

After a delay of time, delay element 206 couples the transition to the high logic state of the signal on line 50 to line 42 and AND gate 202 at time t4. As previously described, the delay of time introduced by delay element 206 compensates for the intrinsic delay in system 200. The time delay between t2 and t4 is the delay time $t_e$ of delay element 206.

When the low logic state on line 50 is coupled to the active low input of AND gate 202 by delay element 206, AND gate 202 transitions the signal on line 48 from a low logic state to a high logic state at time t5. The time delay between t4 and t5 is the delay of AND gate 202. At time t6, driver 210 will then be enabled to drive bi-directional bus 52. The time difference between times t5 and t6 includes the time required for the signal on line 48 to travel to driver 210 and receiver 212, the time required to enable driver 210, and the time required to disable receiver 212.

From time t1 to time t6 asynchronous anticontention circuitry 26 transitions control of bi-directional bus 52 from second device 22 to first device 20 while preventing bus contention between input/output circuitry 34 and input/output circuitry 32. To avoid bus contention on bi-directional bus 52, the time difference between time t2 and time t3 must less than the time difference between time t2 and time t6. Preferably, time $t_e$ should be greater than time $t_d$.

As further illustrated in FIG. 4, asynchronous anticontention circuitry 26 transitions control of bi-directional bus 52 from first device 20 back to second device 22 at time t7 through time t12.

At some point in time after time t6, driver select control circuitry 24 will communicate to asynchronous anticontention circuitry 26 that input/output circuitry 34 should have control of bi-directional bus 52. At time t7, driver select control circuitry 24 transitions the driver select signal on line 36 to a low logic state (inactive). This will cause AND gate 202 to transition the signal on line 48 from a high logic state to a low logic state at time t8.

After the signal on line 48 transitions to a low logic state at time t8, driver 210 will be disabled from driving data onto bi-directional bus 52 at time t9. The difference between times t7 and t9 includes the delay of AND gate 202, the time required for a signal to travel to driver 210 and receiver 212, the time required to disable driver 210, and the time required to enable receiver 212.

When the low logic state on line 48 is coupled to one of the active low inputs of AND gate 204, AND gate 204 transitions the signal on lines 44 and 50 from a low logic state to a high logic state at time t10. The difference between times t8 and t10 includes the delay of AND gate 204. At time t11, driver 214 will then be enabled to drive bi-directional bus 52. The time difference between times t10 and t11 includes the intrinsic delay $t_d$ of system 200. The intrinsic delay of system 200 includes the time required for the signal on line 50 to travel from the output of AND gate 204 to input/output circuitry 34, time required to enable driver 214 to drive bi-directional bus 52, and time required to disable receiver 216 from receiving data from bi-directional bus 52.

After a delay of time, delay element 206 couples the transition to the inactive state of the signal on line 50 to line 42 and AND gate 202 at time t12. The time delay between times t10 and t12 is the delay time $t_e$ of delay element 206.

The compensating delay associated with delay element 206 comes into play only when input/output circuitry 34 is being disabled from driving bi-directional bus 52 and input/output circuitry 32 is being enabled to drive bi-directional bus 52.

It will be appreciated by one of ordinary skill in the art that anticontention circuitry 28 may comprise different circuit elements which achieve the same function as AND gates 202 and 204. For one embodiment, AND gate 204 may be a NOR gate. For another embodiment, AND gate 202 may be replaced by an AND gate having no active low inputs, and AND gate 204 may be replaced with an OR gate having no active low inputs.

It will also be appreciated by one of ordinary skill in the art that the active and inactive logic states for the driver select signal on line 36, the signal on line 48, and the signal on line 50 may be changed and the circuit elements of anticontention circuitry 28 altered accordingly. For example, if driver 214 is enabled when the signal on line 50 is low and the select signal on line 36 is low, and driver 210 is enabled when the signal on line 210 is high, then AND gate 202 may be replaced with an AND gate having no active low inputs, and AND gate 204 may be replaced with a NOR gate having no active low inputs.

The embodiment illustrated in FIG. 2 may be altered so that neither first device 20 nor second device 22 drives data onto bi-directional bus 52 at a given time. For one embodiment, a tri-state control signal may be applied to an additional input of each of AND gates 202 and 204. For another embodiment, additional AND gates may be coupled to lines 48 and 50. For example, an AND gate having two inputs may be coupled to line 48. One input of the AND gate would receive the signal on line 48 and the other input of the AND gate would receive a tri-state control signal. The output of the AND gate would then be coupled to driver 210 and receiver 212. A similar configuration may also be coupled to line 50.

Figure 5:
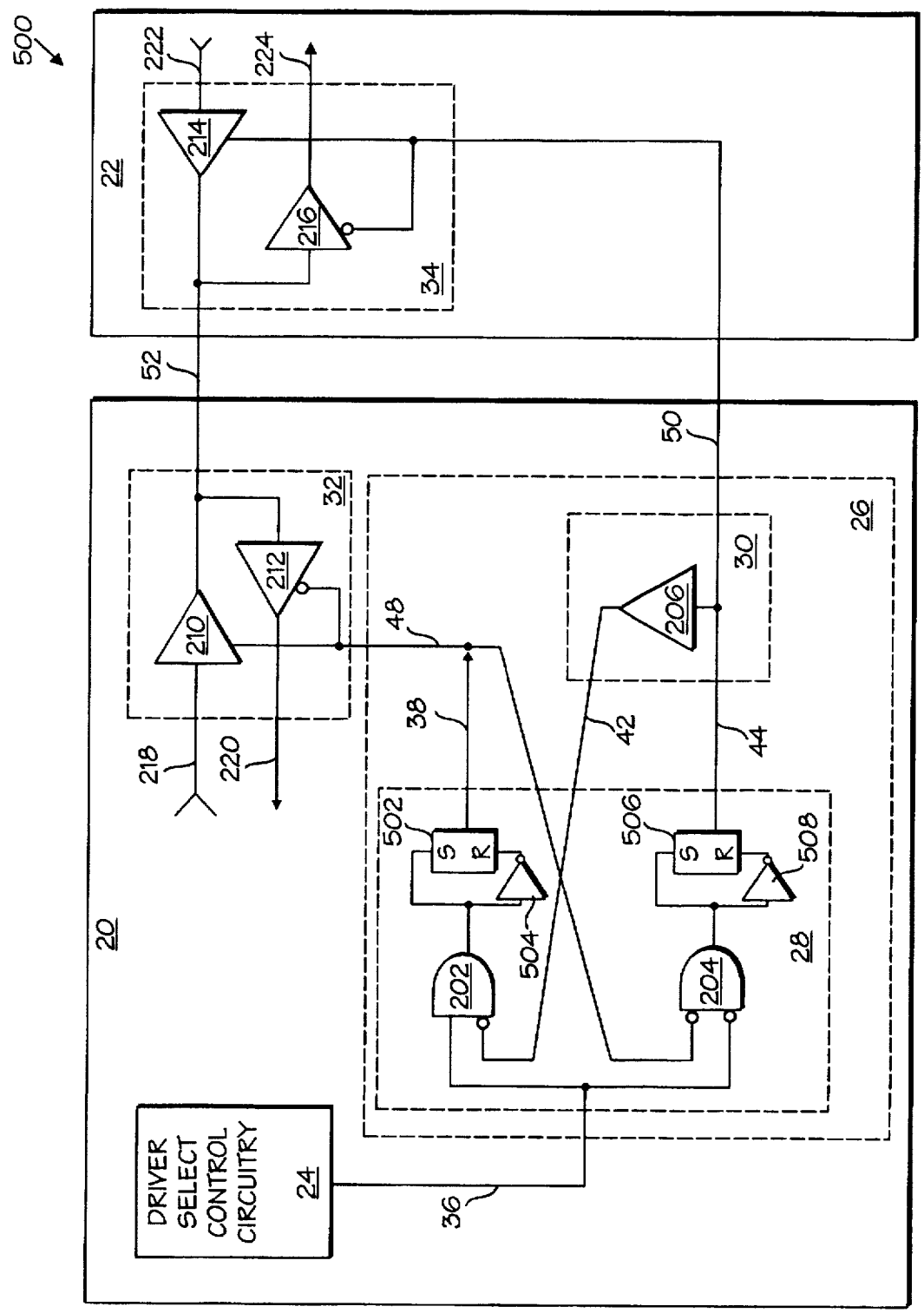
FIG. 5 is a circuit diagram of an embodiment of the present invention including buffers.

FIG. 5 illustrates system 500 which is another embodiment of system 200 shown in FIG. 2. System 500 includes two buffers in anticontention circuitry 28. The input of one buffer is coupled to AND gate 202, and the input of the other buffer is coupled to AND gate 204.

The first buffer comprises SR register 502 and an inverter 504. The S input of SR register 502 and the input of inverter 504 are coupled to the output of AND gate 202. The R input of SR register 502 is coupled to the output of inverter 504. The output of SR register 502 is coupled to line 48. The second buffer comprises SR register 506 and inverter 508. The S input of SR register 506 and the input of inverter 508 are coupled to the output of AND gate 204. The R input of SR register 506 is coupled to the output of inverter 508. The output of SR register 506 is coupled to lines 44 and 50.

The outputs of SR registers 502 and 506 provide sufficient drive capability to drive lines 48 and 50 and reduce undesirable transmission line effects on lines 48 And 50. Additionally, SR registers 502 and 506 can help prevent short duration transients on the outputs of AND gate 202 and 204 from causing bus contention problems on bi-directional bus 52. This is because the short duration transients on the outputs of AND gates 202 and 204 may not be of a sufficient amplitude or of a sufficient duration of time to cause SR registers 502 and 506 to be either set or reset.

SR registers 502 and 506 should be designed to be reset dominant such that when a conflict occurs between the S and R inputs, the state of the R input determines the output of SR registers 502 and 506. Thus, when the S and R inputs both receive a high logic state, the output of SR registers 502 and 506 are a low logic state, and when the S and R inputs both receive a low logic state, the output of SR registers 502 and 506 are a high logic state.

It will be appreciated that other types of buffers may also be implemented within the scope and spirit of the present invention. For example, the two buffers coupled to the outputs of AND gates 202 and 204 may comprise inverting or non-inverting buffers having appropriately sized aspect ratios so as not to react to particular short duration transients output from AND gates 202 and 204.

For another embodiment, only one buffer may be coupled to the output of one of AND gates 202 or 204.

System 500 functions in generally the same manner as system 200 of FIG. 2 because the buffers are non-inverting buffers. Given that a delay is introduced by each buffer, system 500 will guarantee that no bus contention will occur on bi-directional bus 52 when the intrinsic delay of system 500 is less than the sum of the compensating delay of delay element 206, the inverter delay of the active low input of AND gate 202, the propagation delay of AND 202, and the delay associated with setting SR register 502. The intrinsic delay of system 500 includes the time required to disable or enable driver 214 and receiver 216 after a signal is generated on line 50 by SR register 506.

Figure 6:
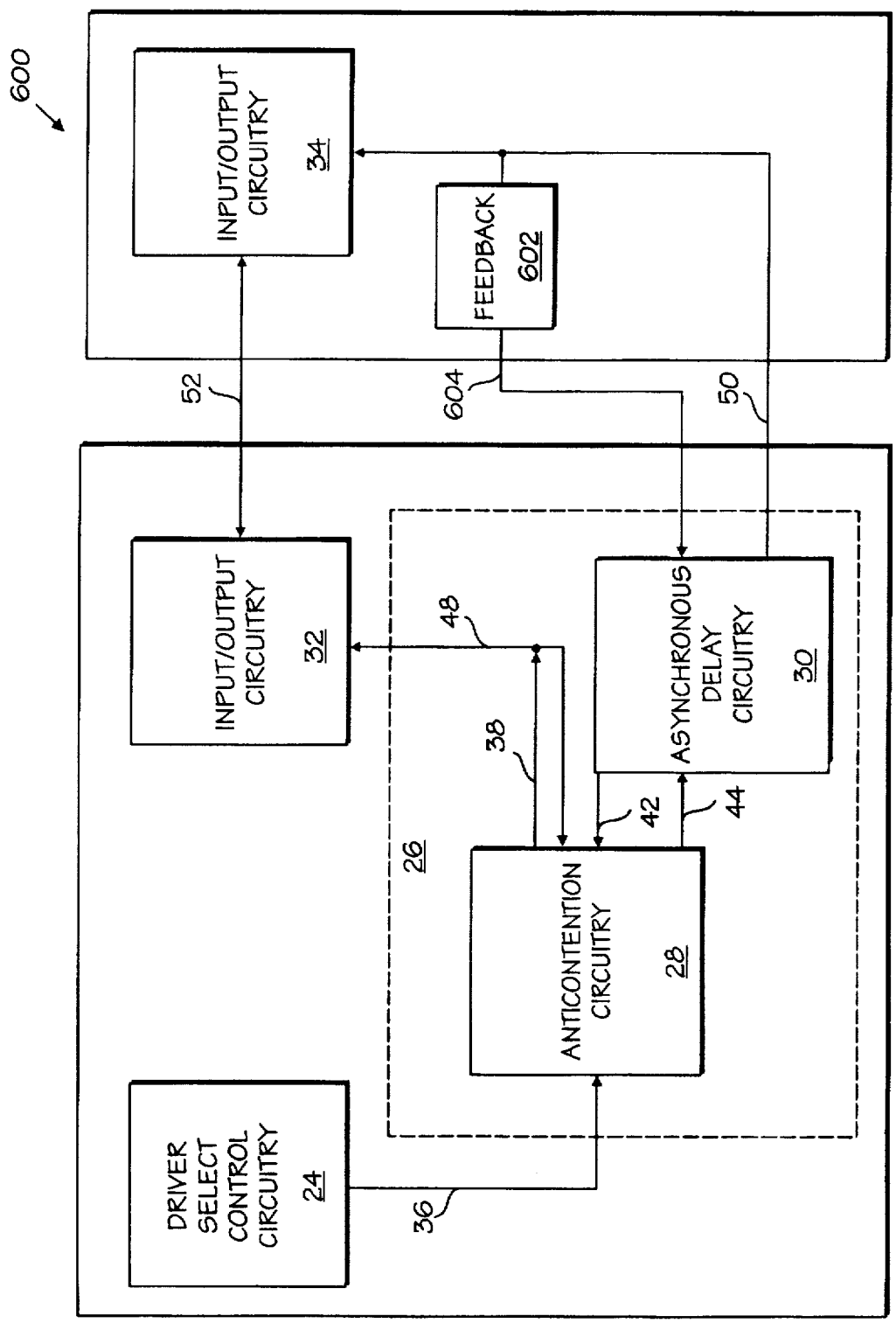
FIG. 6 is a block diagram of an embodiment of the present invention including feedback circuitry.

FIG. 6 illustrates system 600 which is another embodiment of system 10 illustrated in FIG. 1. Second device 22 includes feedback circuitry 602 coupled to line 50 and line 604. Feedback circuitry 602 couples the signal on line 50 back to asynchronous delay circuitry 30 and asynchronous anticontention circuitry 26 on line 604.

In this embodiment, first device 20 and second device 22 each have one output and one input to accommodate bus arbitration. The output of first device 20 outputs the signal on line 50 to the input of second device 22. The output of second device 22 outputs the feedback signal on line 604 to the input of first device 20.

Asynchronous anticontention circuitry 26 prevents contention on bi-directional bus 52 with the aide of feedback circuitry 602 as follows. Assume that driver select control circuitry 24 has generated a driver select signal line on line 36 having a first logic state for a period of time so that input/output circuitry 34 controls bi-directional bus 52. At a later point in time, driver select control circuitry 24 determines that input/output circuitry 32 should have access to and drive data on bi-directional bus 52.

Driver select control circuitry 24 transitions the driver select signal on line 36 to a second logic state. Anticontention circuitry 28 then generates a signal on line 44. In response to the signal on line 44, asynchronous delay circuitry 30 generates a signal on line 50. The signal on line 50 disables input/output circuitry 34 from driving data onto bi-directional bus 52. For one embodiment, the signal on line 44 is the same signal as the signal on line 50.

It will take a certain amount of time due to an intrinsic delay of system 600 for the signal generated by asynchronous delay circuitry 30 to travel across line 50 and to disable input/output circuitry 34 from driving data onto bi-directional bus 52. After the signal on line 50 has traveled from asynchronous delay circuitry 30 to second device 22, the signal is fed back to asynchronous delay circuitry 30 by feedback circuitry 602. In response to the signal on line 50 and the signal fed back from feedback circuitry 602 on line 604, asynchronous delay circuitry 30 generates a signal on line 42.

In response to the signal on line 42 and the device select signal on line 36, anticontention circuitry 28 generates a signal on lines 38 and 48 that enables input/output circuitry 32 to drive data onto bi-directional bus 52.

When driver select control circuitry 24 determines that input/output circuitry 34 should again drive data onto bi-directional bus 52, driver select control circuitry 24 transition the driver select signal on line 36 from the second logic state to the first logic state. This causes anticontention circuitry 28 to generate a signal on line 48 that disables input/output circuitry 32 from driving data onto bi-directional bus 52.

Anticontention circuitry 28 also generates another signal on line 44 in response to the transition by driver select signal on line 36. The signal on line 44 causes asynchronous delay circuitry 30 to generate a signal on line 50 that enables input/output circuitry 34 to drive data onto bi-directional bus 52.

Figure 7:
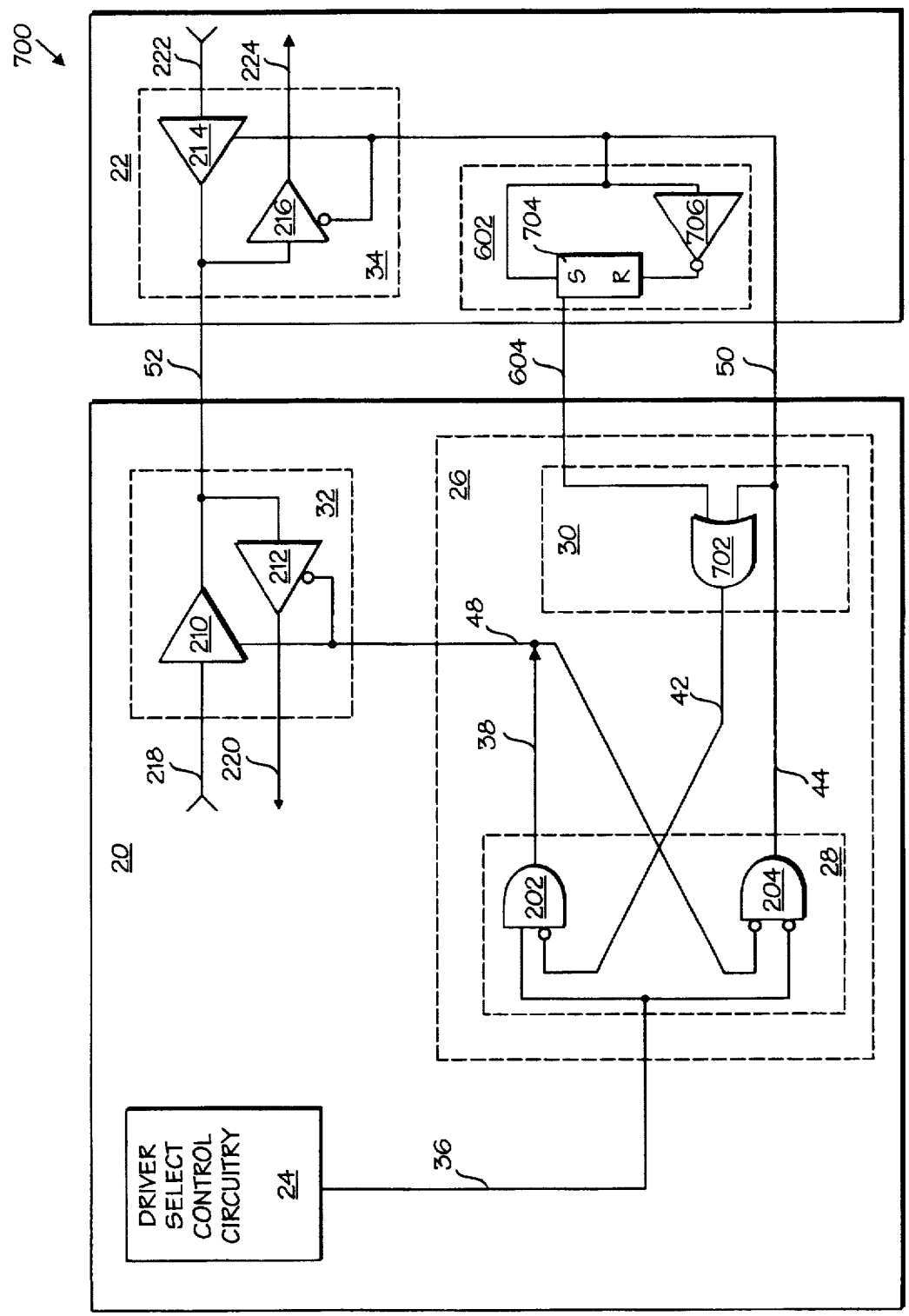
FIG. 7 is a circuit diagram of another embodiment of the present invention including feedback circuitry.

FIG. 7 illustrates system 700 which is one embodiment for system 600 illustrated in FIG. 6. As in system 200 of FIG. 2, anticontention circuitry 208 comprises AND gates 202 and 204, input/output circuitry 32 comprises driver 210 and receiver 212, and input/output circuitry 34 comprises driver 214 and receiver 216.

Feedback circuitry 602 includes a buffer which comprises SR register 704 and inverter 706. The S input of SR 704 and the input of inverter 706 are coupled to line 50. The output of inverter 706 is coupled to the R input of SR register 704. The output of SR register 704 is coupled to one input of OR gate 702 via line 604. The other input of OR gate 702 is coupled to line 50. The output of OR gate 702 is coupled to the active low input of AND gate 202 via line 42.

The output of the SR register 704 provides sufficient drive capability to drive line 604 and reduces undesirable transmission line effects on line 604. The undesirable transmission line effects may cause short duration transients to inadvertently upset the output of OR gate 702. SR register 704 should be designed to be reset dominant.

For another embodiment, feedback circuitry 602 may comprise any other type of buffer known by those generally skilled in the art, including a CMOS transmission gate, two back-to-back inverters, and n-channel or p-channel MOSFET pass gates.

For another embodiment, feedback circuitry 602 may comprise a direct connection from line 50 (within second device 22) back to one input of OR gate 702 via line 604. For yet another embodiment, OR gate 702 is not required and the output of SR register 704 is coupled to line 42 via line 604. For yet another embodiment, OR gate 702 is not required and feedback circuitry 602 comprises a direct connection from line 50 (within second device 22) back to line 42 via line 604.

Figure 8:
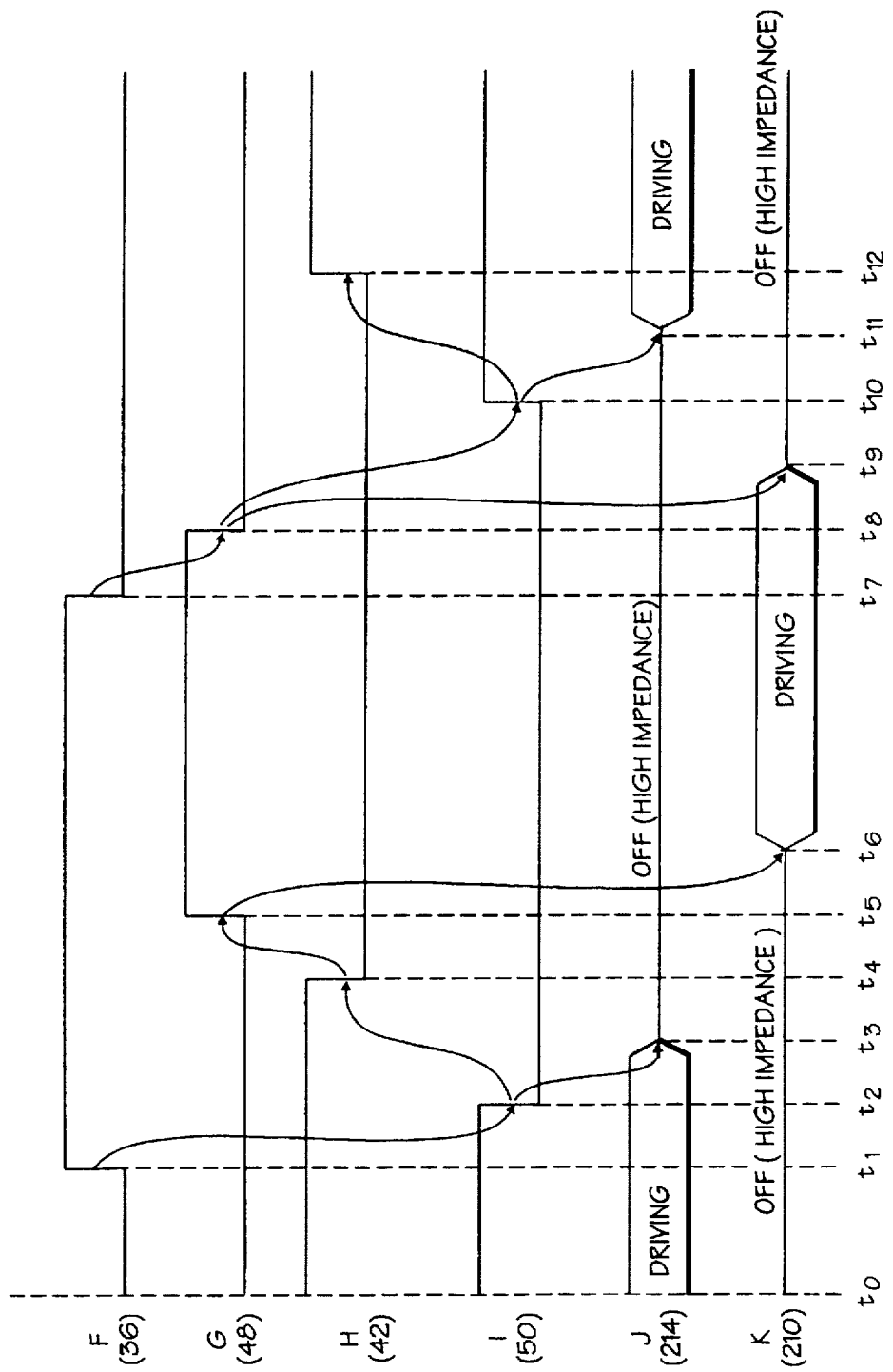
FIG. 8 is a timing waveform diagram for the embodiment of the present invention illustrated in FIG. 7.

The operation of the circuitry illustrated in FIG. 7 will be described with the aide of the illustrative timing waveform diagram shown in FIG. 8. In FIG. 8, waveform F corresponds to the driver select signal on line 36, waveform G corresponds to the signal on line 48, waveform H corresponds to the signal on line 42, waveform I corresponds to the signal on line 50, waveform J corresponds to the output of driver 214 driving bi-directional bus 52 (high and low levels indicate driver 214 is driving data onto bi-directional bus 52, and an intermediate level represented by a solid single line indicates that driver 214 is not driving bi-directional bus 52 and is in a high impedance state), and waveform K corresponds to the output of driver 210 driving bi-directional bus 52 (high and low levels indicate driver 210 is driving data onto bi-directional bus 52, and an intermediate level represented by a solid single line indicates that driver 210 is not driving bi-directional bus 52 and is in a high impedance state).

At time t0, the driver select signal on line 36 is in a low logic state, the signal on line 48 is in a low logic state or inactive, the signals on line 50 is in a high logic state or active, the output of SR register 704 is in a high logic state, the signal on line 42 is in a high logic state, input/output circuitry 34 is enabled to drive data onto bi-directional bus 52, and input/output circuitry 32 is disabled from driving data onto bi-directional bus 52.

At some point in time after time t0, driver select control circuitry 24 will communicate to asynchronous anticontention circuitry 26 that input/output circuitry 32 should have control of bi-directional bus 52. At time t1, driver select control circuitry 24 transitions the driver select signal on line 36 to a high logic state. This will cause the signal on line 44 and line 50 to transition from a high logic state to a low logic state at time t2. The signal on line 42 will not transition to a low logic state at time t2 because the output of SR register 704 is still in a high logic state.

After the signal on line 50 has transitioned to the low logic state at time t2, driver 214 will be disabled from driving data onto bi-directional bus 52 at time t3. The difference between times t2 and t3 includes the intrinsic delay associated with system 700. The intrinsic delay includes the time required for the signal on line 50 to travel from the output of AND gate 204 to input/output circuitry 34, time required to disable driver 214 from driving bi-directional bus 52, and time required to enable receiver 216 to receive data from bi-directional bus 52.

When the low logic state of the signal on line 50 reaches feedback circuitry 602, the low logic state causes SR register 704 to be reset and output a low logic state to OR gate 702 on line 604. At time t4, OR gate 702 transitions the signal on line 42 to a low logic state because both of the inputs to OR gate 702 are low logic states.

When OR gate 702 transitions the signal on line 42 to a low logic state at time t4, AND gate 202 transitions the signal on line 48 from a low logic state to a high logic state at time t5. At time t6, driver 210 will then be enabled to drive bi-directional bus 52. The time difference between times t2 and t5 includes the delay time of feedback circuitry 602, OR gate 702, and AND gate 202. The time difference between times t5 and t6 includes the time required for the signal on line 48 to travel to driver 210 and receiver 212, the time required to enable driver 210, and the time required to disable receiver 212.

From time t1 to time t6 asynchronous anticontention circuitry 26 transitions control of bi-directional bus 52 from input/output circuitry 34 of second device 22 to input/output circuitry 32 of first device 20 while preventing bus contention between input/output circuitry 34 and input/output circuitry 32. Bus contention is prevented because the active low signal generated by AND gate 204 on line 50 is not immediately coupled back to AND gate 202; rather, the signal first travels to second device 22 before being fed back to OR gate 702.

As further illustrated in FIG. 8, asynchronous anticontention circuitry 26 transitions control of bi-directional bus 52 from first device 20 back to second device 22 at time t7 through time t12.

At some point in time after time t6, driver select control circuitry 24 will communicate to asynchronous anticontention circuitry 26 that input/output circuitry 34 should have control of bi-directional bus 52. At time t7, driver select control circuitry 24 transitions the driver select signal on line 36 to a low logic state. This will cause AND gate 202 to transition the signal on line 48 from a high logic state to a low logic state at time t8.

After the signal on line 48 has transitioned to a low logic state at time t8, driver 210 will be disabled from driving data onto bi-directional bus 52 at time t9. The difference between times t8 and t9 includes the time required for a signal on line 48 to travel to driver 210 and receiver 212, the time required to disable driver 210, and the time required to enable receiver 212.

When the low logic state on line 48 is coupled to one of the active low inputs of AND gate 204, AND gate 204 transitions the signal on lines 44 and 50 from a low logic state to a high logic state at time t10. The time delay between time t8 and t10 is the delay of AND gate 204. At time t11, driver 214 will then be enabled to drive bi-directional bus 52. When the active signal on line 50 reaches feedback circuit 602, SR register 704 is set and outputs a high logic state on line 604.

The time difference between times t10 and t11 includes the intrinsic delay of system 700. The intrinsic delay includes the time required for the signal on line 50 to travel from the output of AND gate 204 to input/output circuitry 34, time required to enable driver 214 to drive bi-directional bus 52, and time required to disable receiver 216 from receiving data from bi-directional bus 52.

At time t12, signal on line 42 transitions from a low logic state to a high logic state. The delay time between times t10 and t12 is the delay due to transmitting the signal from AND gate 204 to second device 22, the delay time of feedback circuitry 602, the delay time of line 604, and the delay time of OR gate 702.

It will be appreciated that OR gate 702 and buffer comprising SR register 704 and inverter 706 may be replaced with other circuit components that perform a similar function without departing from the scope and spirit of the present invention. For example, feedback circuitry 602 may comprise an inverter and OR gate 702 may have an active low input coupled to line 604.

For another embodiment, buffers may be coupled to the outputs of AND gates 202 and 204 as was previously illustrated in FIG. 5. The buffers would provide sufficient drive capability to drive lines 48 and 50 and reduce undesirable transmission line effects on lines 48 and 50. Additionally, the buffers would help prevent short duration transients on the outputs of AND gate 202 and 204 from causing bus contention problems on bi-directional bus 52. This is because the short duration transients on the outputs of AND gates 202 and 204 may not be of a sufficient amplitude or of a sufficient duration of time to cause SR registers 502 and 506 to be either set or reset. These buffers would, however, also add extra delay to system 700.

For another embodiment, a buffer may be added to the output of OR gate 702. This buffer would compensate for noise that may be present on line 604 and which may cause OR gate 702 to inadvertently output the wrong state for a period of time.

The previous embodiments illustrated in FIGS. 1, 2, 5, 6, and 7 may be extended to a system having more than two devices. Any number of device may be coupled to a bi-directional bus wherein one of the devices includes asynchronous anticontention circuitry as illustrated in FIGS. 1, 2, 5, 6 and 7.

Figure 9:
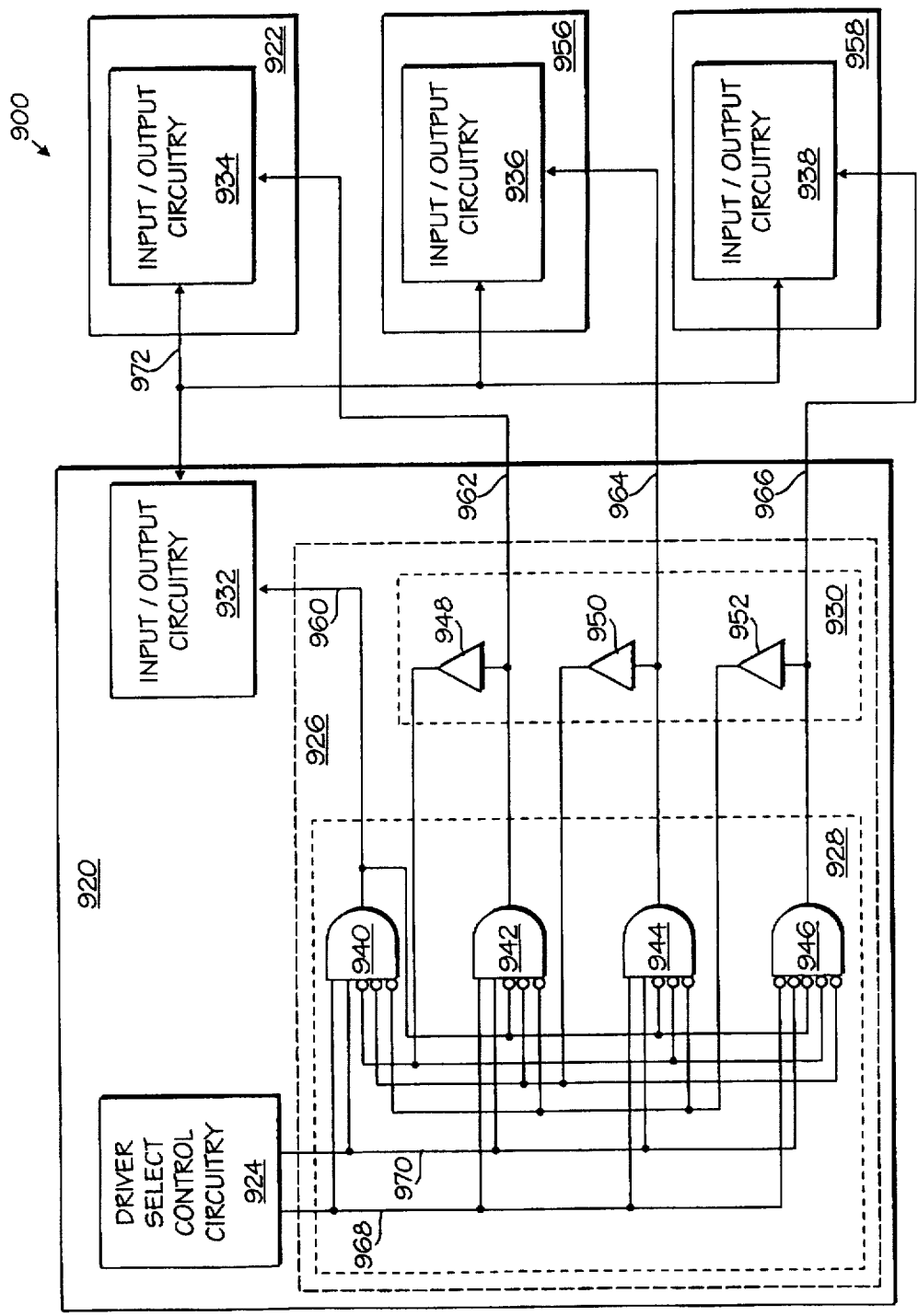
FIG. 9 is a circuit diagram of another embodiment of the present invention.

FIG. 9 illustrates one embodiment of the present invention including four devices coupled to a bi-directional bus 972. FIG. 9 shows a system 900 comprising first device 920, second device 922, third device 956, and fourth device 958 each coupled to bi-directional bus 972. Devices 920, 922, 956 and 958 may each comprise integrated circuits, discrete circuits, or systems. For one embodiment, devices 920, 922, 956 and 958 are included in a single device.

First device 920 includes asynchronous anticontention circuitry 926 coupled to driver select control circuitry 924 and input/output circuitry 932. Input/output circuitry 932 is coupled to bi-directional bus 972. First device 920 also includes three outputs to accommodate bus arbitration: one output for line 962, one output for line 964, and one output for line 966.

Second device 922 includes input/output circuitry 934 coupled to bi-directional bus 972 and line 962. Third device 956 include input/output circuitry 936 coupled to bi-directional bus 972 and line 964. Fourth device 958 includes input/output circuitry 938 coupled to bi-directional bus 972 and line 966. Asynchronous anticontention circuitry 926, input/output circuitry 932, input/output circuitry 934, input/output circuitry 936, and input/output circuitry 938 comprise asynchronous contention prevention circuitry for bi-directional bus 972. Bi-directional bus 972 may comprise a single bi-directional line or a plurality of bi-directional lines.

Driver select control circuitry 924 comprises control circuitry that determines which of devices 920, 922, 956, or 958 should control or drive data onto bi-directional bus 972. For one embodiment, driver select control circuitry 924 may be part of a system state machine controller for system 900 or a state machine controller of first device 920. For an alternative embodiment, driver select control circuitry 924 may be circuitry which communicates with the system state machine controller or the state machine controller of first device 920.

Anticontention circuitry 928 comprises four five-input AND gates 940, 942, 944 and 946. Asynchronous delay circuitry 930 comprises three delay elements 948, 950, and 952. The output of AND gate 940 is coupled to line 960 and to an active input of each of AND gate 942, 944, and 946. The input of delay element 948 is coupled to line 962, and the output of delay element 948 is coupled to an active low input of each of AND gates 940, 944, and 946. The input of delay element 950 is coupled to line 964, and the output of delay element 950 is coupled to an active low input of each of AND gates 940, 942, and 946. The input of delay element 952 is coupled to line 966, and the output of delay element 952 is coupled to an active low input of each of AND gates 940, 942, and 944.

Driver select control circuitry 924 generates two driver select signals and couples the driver select signals to asynchronous anticontention circuitry 926 via lines 968 and 970. The driver select signals indicate which device may drive data onto bi-directional bus 972. For example, when the driver select signals each comprise a low logic state, asynchronous anticontention circuitry 926 sends a signal on line 966 to input/output circuitry 938 which enables input/output circuitry 938 to drive data onto bi-directional bus 972. When the driver select signals each comprise a high logic state asynchronous anticontention circuitry 926 sends a signal on line 960 to input/output circuitry 932 which enables input/ output circuitry 932 to drive data onto bi-directional bus 972. When the driver select signals comprise a low logic state and a high logic state on line 968 and 970, respectively, asynchronous anticontention circuitry 926 sends a signal on line 962 to input/output circuitry 934 which enables input/ output circuitry 934 to drive data onto bi-directional bus 972. When the driver select signals comprise a high logic state and a low logic state on lines 968 and 970, respectively, asynchronous anticontention circuitry 926 sends a signal on line 964 to input/output circuitry 936 which enables input/ output circuitry 936 to drive data onto bi-directional bus 972.

The embodiment of FIG. 9 functions in a similar manner as the embodiment illustrated in FIG. 2. For one example, assume that driver select control circuitry 924 is generating low logic states on each of line 968 and 970, the signal on line 966 is in a high logic state, and input/output circuitry 938 is driving data on bi-directional bus 972. At some point later in time, driver select control circuitry 924 determines that input/output circuitry 932 should drive bi-directional bus 972. Driver select control circuitry generates a high logic state on line 968 and 970 which causes the AND gate 946 to transition the signal on line 952 from an active state to an inactive state. After an intrinsic delay of time, input/output circuitry 938 will be disabled from data onto bi-directional bus 972.

After a compensating delay of time, delay element 952 will couple the transition of the low signal on line 966 to AND gates 940, 942 and 944. AND gate 940 will then transition the signal on line 960 from a low logic state to a high logic state. The high logic state on line 960 will enable input/output circuitry 932 to drive bi-directional bus 972.

It will be appreciated that in order to avoid bus contention on bi-directional bus, the intrinsic delay associated with AND gate 946, line 966 and input/output circuitry 938 must be less than the sum of the compensating delay of delay element 952, the propagation delay to invert the input to AND gate 940, and the propagation delay of AND gate 940.

For one embodiment, the intrinsic delay associated with AND gate 942, line 962, and input/output circuitry 934, and the intrinsic delay associated with AND gate 944, line 964, and input/output circuitry 936, may be equal to the intrinsic delay associated with AND gate 946, line 966, and input/output circuitry 938. For another embodiment, the intrinsic delays may each be different.

For another embodiment, the compensating delay associated with each of delay elements 948, 950, and 952 may be equal. For another embodiment, the compensating delay associated with each of delay elements 948, 950, and 952 may be different. All of the compensating delays of delay elements 948, 950, and 952 (plus the delays of AND gates 940, 942, 944, and 946) must be greater than the longest intrinsic delay in order to disable input/output circuits 934, 936, and 938 and avoid bus contention.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An asynchronous contention prevention circuit comprising:
    an anticontention circuit receiving a driver select signal and generating a first signal and a second signal each having an active state and an inactive state; and
    an asynchronous delay circuit coupled to the anticontention circuit and including a programmable delay element, wherein:
        when the driver select signal is in a first logic state, the first signal is in the inactive state and the second signal is in the active state;
        when the driver select signal transitions from the first logic state to a second logic state, the second signal transitions from the active state to the inactive state and, after a delay of time, the first signal transitions from the inactive state to the active state.

2. The asynchronous contention prevention circuit of claim 1, wherein the anticontention circuit comprises:
    a first logic element capable of generating the first signal; and
    a second logic element capable of generating the second signal.

3. The asynchronous contention prevention circuit of claim 1, wherein the asynchronous delay circuit further comprises at least one inverting or non-inverting buffer.

4. The asynchronous contention prevention circuit of claim 1, further comprising a driver select control circuit coupled to the anticontention circuit, the driver select control circuit generating the driver select signal.

5. An asynchronous contention prevention circuit comprising:
    an anticontention circuit receiving a driver select signal and generating a first signal and a second signal each having an active state and an inactive state; and
    an asynchronous delay circuit coupled to the anticontention circuit and including a resistor, wherein:
        when the driver select signal is in a first logic state, the first signal is in the inactive state and the second signal is in the active state;
        when the driver select signal transitions from the first logic state to a second logic state, the second signal transitions from the active state to the inactive state and, after a delay of time, the first signal transitions from the inactive state to the active state.

6. The asynchronous contention prevention circuit of claim 5, wherein the anticontention circuit comprises:
    a first logic element capable of generating the first signal; and
    a second logic element capable of generating the second signal.

7. The asynchronous contention prevention circuit of claim 5, wherein the asynchronous delay circuit further including at least one inverting or non-inverting buffer.

8. An asynchronous contention prevention circuit comprising:
    an anticontention circuit receiving a driver select signal and generating a first signal and a second signal each having an active state and an inactive state;
    an asynchronous delay circuit coupled to the anticontention circuit;
    a first input/output circuit having a first input coupled to the anticontention circuit and a first output, the first input/output circuit receiving the first signal; and
    a second input/output circuit having a second input coupled to the anticontention circuit and the asynchronous delay circuit and a second output, the second input receiving the second signal, wherein:
        when the driver select signal is in a first logic state, the first signal is in the inactive state, the first input/output circuit is disabled from driving the first output, the second signal is in the active state, and the second input/output circuit drives the second output; and
        when the driver select signal transitions from the first logic state to a second logic state, the second signal transitions from the active state to the inactive state disabling the second input/output circuit from driving the second output and, after a delay of time, the first signal transitions from the inactive state to the active state enabling the first input/output circuit to drive the first output.

9. The asynchronous contention prevention circuit of claim 8, further comprising a bi-directional bus coupled to the first output of the first input/output circuit and the second output of the second input/output circuit.

10. The asynchronous contention prevention circuit of claim 8, wherein the anticontention circuit comprises:
    a first logic element capable of generating the first signal; and a second logic element capable of generating the second signal.

11. The asynchronous contention prevention circuit of claim 8, wherein the asynchronous delay circuit comprises a programmable delay element.

12. The asynchronous contention prevention circuit of claim 8, wherein the asynchronous delay circuit comprises at least one inverting or non-inverting buffer.

13. The asynchronous contention prevention circuit of claim 8, further comprising a driver select control circuit coupled to the anticontention circuit, the driver select control circuit generating the driver select signal.

14. The asynchronous contention prevention circuit of claim 8, further comprising a feedback circuit coupled to the asynchronous delay circuit, the feedback circuit receiving the second signal and coupling the second signal back to the asynchronous delay circuit.

15. The asynchronous contention prevention circuit of claim 14, wherein the feedback circuit comprises a buffer.

16. The asynchronous contention prevention circuit of claim 15, wherein the buffer comprises:
   an SR register having an S input, an R input, and an output, wherein the S input and the output of the SR register are coupled to the second signal and the asynchronous delay circuit, respectively; and
   an inverter having an input and an output, wherein the input of the inverter is coupled to the S input of the SR register and the output of the inverter is coupled to the R input of the SR register.

17. The asynchronous contention prevention circuit of claim 14, wherein the asynchronous delay circuit comprises a logic element having a first input, a second input, and an output, the first input receiving the first signal, the second input coupled to the feedback circuit, and the output of the logic element coupled to the anticontention circuit.

18. An asynchronous contention prevention circuit comprising:
   an anticontention circuit receiving a driver select signal and generating a first signal and a second signal each having an active state and an inactive state;
   an asynchronous delay circuit coupled to the anticontention circuit; and
   a feedback circuit coupled to the asynchronous delay circuit, wherein:
      when the driver select signal is in a first logic state, the first signal is in the inactive state and the second signal is in the active state; and
      when the driver select signal transitions from the first logic state to a second logic state, the second signal transitions from the active state to the inactive state and, after a delay of time the first signal transitions from the inactive state to the active state, and wherein the feedback circuit receives the second signal and couples the second signal back to the asynchronous delay circuit.

19. The asynchronous contention prevention circuit of claim 18, wherein the feedback circuit comprises a buffer.

20. The asynchronous contention prevention circuit of claim 19, wherein the buffer comprises:
   an SR register having an S input, an R input, and an output, wherein the S input and the output of the SR register are coupled to the second signal and the asynchronous delay circuit, respectively; and
   an inverter having an input and an output, wherein the input of the inverter is coupled to the S input of the SR register and the output of the inverter is coupled to the R input of the SR register.

21. The asynchronous contention prevention circuit of claim 18, wherein the asynchronous delay circuit comprises a logic element having a first input, a second input, and an output, the first input receiving the first signal, the second input coupled to the feedback circuit, and the output of the logic element coupled to the anticontention circuit.

22. The asynchronous contention prevention circuit of claim 18, further comprising a first input/output circuit having a first input coupled to the anticontention circuit and a first output, the first input/output circuit receiving the first signal, wherein:
   when the first signal is in the active state, the first input/output circuit is enabled to drive the first output; and
   when the first signal is in the inactive state, the first input/output circuit is disabled from driving the first output.

23. The asynchronous contention prevention circuit of claim 22, further comprising a second input/output circuit having a second input coupled to the anticontention circuit and the asynchronous delay circuit and a second output, the second input receiving the second signal, wherein:
   when the second signal is in the active state, the second input/output circuit is enabled to drive the second output; and
   when the second signal is in the inactive state, the second input/output circuit is disabled from driving the second output.

24. The asynchronous contention prevention circuit of claim 23, further comprising a bi-directional bus coupled to the first output of the first input/output circuit and the second output of the second input/output circuit.

25. A system comprising:
   a first device having:
      an anticontention circuit receiving a driver select signal and generating a first signal and a second signal each having an active state and an inactive state; and
      an asynchronous delay circuit coupled to the anticontention circuit, wherein:
         when the driver select signal is in a first logic state, the first signal is in the inactive state and the second signal is in the active state;
         when the driver select signal transitions from the first logic state to a second logic state, the second signal transitions from the active state to the inactive state and, after a delay of time, the first signal transitions from the inactive state to the active state;
   a second device comprising an input/output circuit having an input coupled to the anticontention circuit and the asynchronous delay circuit and an output, the input receiving the second signal; and
   a bi-directional bus coupled to the first device and the output of the input/output circuit, wherein when the second signal is in the active state the output of the input/output circuit drives the bi-directional bus, and when the second signal is in the inactive state the output of the input/output circuit is disabled from driving the bi-directional bus.

26. The system of claim 25, wherein the system further comprises a device select circuit coupled to the anticontention circuit, wherein the device select circuit generates the driver select signal.

27. The system of claim 25, wherein the second device further comprises a feedback circuit coupled to the asynchronous delay circuit and the input/output circuit, the feedback circuit receiving the second signal and coupling the second signal back to the asynchronous delay circuit.

28. A method of asynchronously preventing contention on a bi-directional bus, the method comprising the steps of:

disabling a first input/output circuit from driving the bi-directional bus in response to a first transition of a driver select signal;

enabling a second input/output circuit to drive the bi-directional bus after a first delay of time;

disabling the second input/output circuit from driving the bi-directional bus in response to a first signal, wherein the first signal is generated in response to a second transition of the driver select signal; and enabling the first input/output circuit to drive the bi-directional bus in response to a second signal, wherein the second signal is generated in response to the first signal and the driver select signal.

29. The method of claim 28, wherein the step of disabling the first input/output circuit comprises the steps of:

generating a third signal in response to the first transition of the driver select signal; and disabling the first input/output circuit from driving the bi-directional bus in response to the third signal.

30. The method of claim 28, wherein the step of enabling the second input/output circuit comprises the steps of:

generating a delayed signal after a second delay of time;

generating a fourth signal in response to the driver select signal and the delayed signal; and enabling the second input/output circuit in response to the fourth signal.

31. An electrical device comprising:

an input/output circuit;

a bi-directional port coupled to the input/output circuit, the bi-directional port being capable of coupling to a bi-directional bus;

an input port coupled to the input/output circuit, the input port capable of receiving a signal from an asynchronous anticontention circuit, wherein the signal:

(a) has a first logic state enabling the input/output circuit to output data through the bi-directional port; and (b) a second logic state enabling the input/output circuit to receive input data through the bi-directional port;

a feedback circuit having an input coupled to the input port and an output; and an output port coupled to the output of the feedback circuit, wherein the feedback circuit is capable of receiving the signal from the input port and causing the output port to output the signal to the asynchronous anticontention circuit.

* * * * *